(12) United States Patent
Mohiuddin et al.

(10) Patent No.: US 7,979,833 B2
(45) Date of Patent: Jul. 12, 2011

(54) DEBUGGING SIMULATION OF A CIRCUIT CORE USING PATTERN RECORDER, PLAYER AND CHECKER

(75) Inventors: Syed B. Mohiuddin, Milpitas, CA (US); Asad Riaz, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 1397 days.

(21) Appl. No.: 10/971,911

(22) Filed: Oct. 23, 2004

(65) Prior Publication Data

US 2006/0101309 A1      May 11, 2006

(51) Int. Cl.
*G06F 17/50* (2006.01)
(52) U.S. Cl. ...................................... 716/136
(58) Field of Classification Search ........ 716/4; 703/16, 703/17; 714/25, 32–34, 37, 39, 45
See application file for complete search history.

(56) References Cited

U.S. PATENT DOCUMENTS

| | | | | |
|---|---|---|---|---|
| 5,903,475 | A * | 5/1999 | Gupte et al. ............... | 703/16 |
| 7,107,567 | B1 * | 9/2006 | LeBlanc .................... | 716/17 |
| 2003/0101393 | A1 * | 5/2003 | Watkins .................... | 714/724 |
| 2003/0145270 | A1 * | 7/2003 | Holt ........................... | 714/766 |
| 2005/0022155 | A1 * | 1/2005 | Broberg et al. ........... | 717/101 |

OTHER PUBLICATIONS

"Format", FLAC online documentation, http://web.archive.org/web/20011213084210/flac.sourceforge.net/format.html, 2001.*
Sinanoglu et al., "Partial Core Encryption for Performance-Efficient Test of SOCs", Proceedings of the 2003 IEEE/ACM International Conference on Computer-aided Design, pp. 91-94.*
Waveform Analyzer Manual, for DK version 3.0, Celoxica Limited, 2004, p. 1-40.
Post Synthesis Gate Level Simulation using Verilog XL, Post synthesis Verification, EE 512, npu, p. 1-16.

* cited by examiner

*Primary Examiner* — Vuthe Siek
*Assistant Examiner* — Aric Lin
(74) *Attorney, Agent, or Firm* — Suiter Swantz pc llo (57) ABSTRACT

Debugging a simulation of a circuit core uses a pattern recorder, a pattern player and a pattern checker to record input stimuli provided to a first core, record output generated by the first core due to the input stimuli, provide the recorded input stimuli to a second core, and determine whether output generated by the second core due to the recorded input stimuli matches the recorded output generated by the first core due to the input stimuli.

19 Claims, 7 Drawing Sheets

DEBUGGING SIMULATION OF A CIRCUIT CORE USING PATTERN RECORDER, PLAYER AND CHECKER

BACKGROUND

Many companies design core circuitry to be integrated by other companies (customers) into the other companies' products. In order for a customer to design its product using a company's core circuitry, the company provides to the customer one or more computer files or modules of resistor transfer logic (RTL) code that describes the core circuitry in a hardware descriptor language (HDL), such as "Verilog" or "VHDL." (This HDL module(s) will be referred to as the "core.") The customer then combines the core with HDL modules of its own circuitry to form a computerized model of its end product, or a portion of the product. The customer can then analyze the performance and debug the design of its product in a computerized simulation using the circuit modules.

In order to protect its proprietary designs or intellectual property, the company may encrypt the core. With only an encrypted core, the customer cannot view the actual RTL code. Instead, the customer is also provided with a module known as a "wrapper" that encapsulates all of the requisite inputs and outputs (I/Os) of the core. The circuit modules of the customer's circuitry interact with the wrapper, which interacts with the core.

The customer compiles the core and wrapper along with the customer's circuit modules to form a simulation environment or "test bench." When the customer runs the simulation, various types of problems or errors may occur requiring troubleshooting or debugging. Some of the most common problems or errors may be a result of a flaw in the design of the customer's circuit modules, a flaw in the design of the company's core or a mistake in the compilation of the core. Once the design flaws are corrected and all of the circuit modules, including the core, are properly compiled, the simulation may indicate that the circuit modules represent or define a useable design for the customer's product.

In the troubleshooting or debugging of the problems or errors that occur during the simulations, the customer can readily examine the circuit modules of its circuitry for any bugs or design flaws. The customer can do so because the customer has the source code for the circuit modules, which are written in the HDL, which is readable and understandable to a person who is well versed in the HDL. However, if the company has provided only an encrypted core (and the wrapper) to the customer, then the customer cannot very well investigate a problem that apparently occurs in the company's core. Instead, the customer may provide proper input stimuli from its circuit modules to the core, but get unknown or wrong output values, and not be able to troubleshoot the problem. Therefore, the customer must work with the company to troubleshoot or debug a problem or error that occurs in the company's core, including to determine whether the customer simply compiled the core improperly, to examine the source code of the core for design flaws, etc.

Since the customer cannot examine the company's core, the customer must inform the company of the problem and allow the company to do part or all of the troubleshooting. To troubleshoot the problem, the company may have to reproduce the problem in its own lab using its own simulator. To reproduce the problem, one of the steps that the company needs to take is to provide the input stimuli to the core in essentially the same manner as did the customer. It is usually the customer's circuit modules that generated the input stimuli for the core during the simulation of the entire environment. However, the customer's circuit modules typically contain valuable proprietary designs or intellectual property, so the customer may not be willing to provide its circuit modules to the company. Therefore, in order for the company to be able to provide the proper input stimuli to its core in the company's simulation environment, the customer usually has to generate a waveform data file of the input stimuli in the customer's simulation environment. The waveform data file is generally a "dump" or "trace" of the waveform of the relevant signals. The company can then simulate the performance of the core using the customer's waveform data file to supply the input stimuli to the core.

There are a variety of different waveform data formats that can be used to generate the waveform data file. For example, the "value change dump" (VCD) file incorporates one such waveform data format, which is specified in the IEEE 1364-1995 standard. The customer's simulator generates the waveform data file in the customer's simulation environment, and the company's simulator reads signal patterns from the waveform data file in the company's simulation environment.

Various difficulties arise when using waveform data files in this manner. For instance, it is usually necessary to pre-process the waveform data file to put it in a useable format, since the company may use a different simulator or simulation environment. Additionally, even for a standard waveform data file, such as the VCD file, the format is not consistent and may not be readily available to the company. For example, different representations may be used to represent the values of buses (e.g. bus representation can be either 8'h00000000 or 8'h0). Furthermore, some customers may use simulators that cannot easily generate a waveform data file. Moreover, some simulations may result in very large waveform data files, which can make pre-processing very time consuming.

It is with respect to these and other considerations that the present invention has evolved.

DETAILED DESCRIPTION

Figure 1:
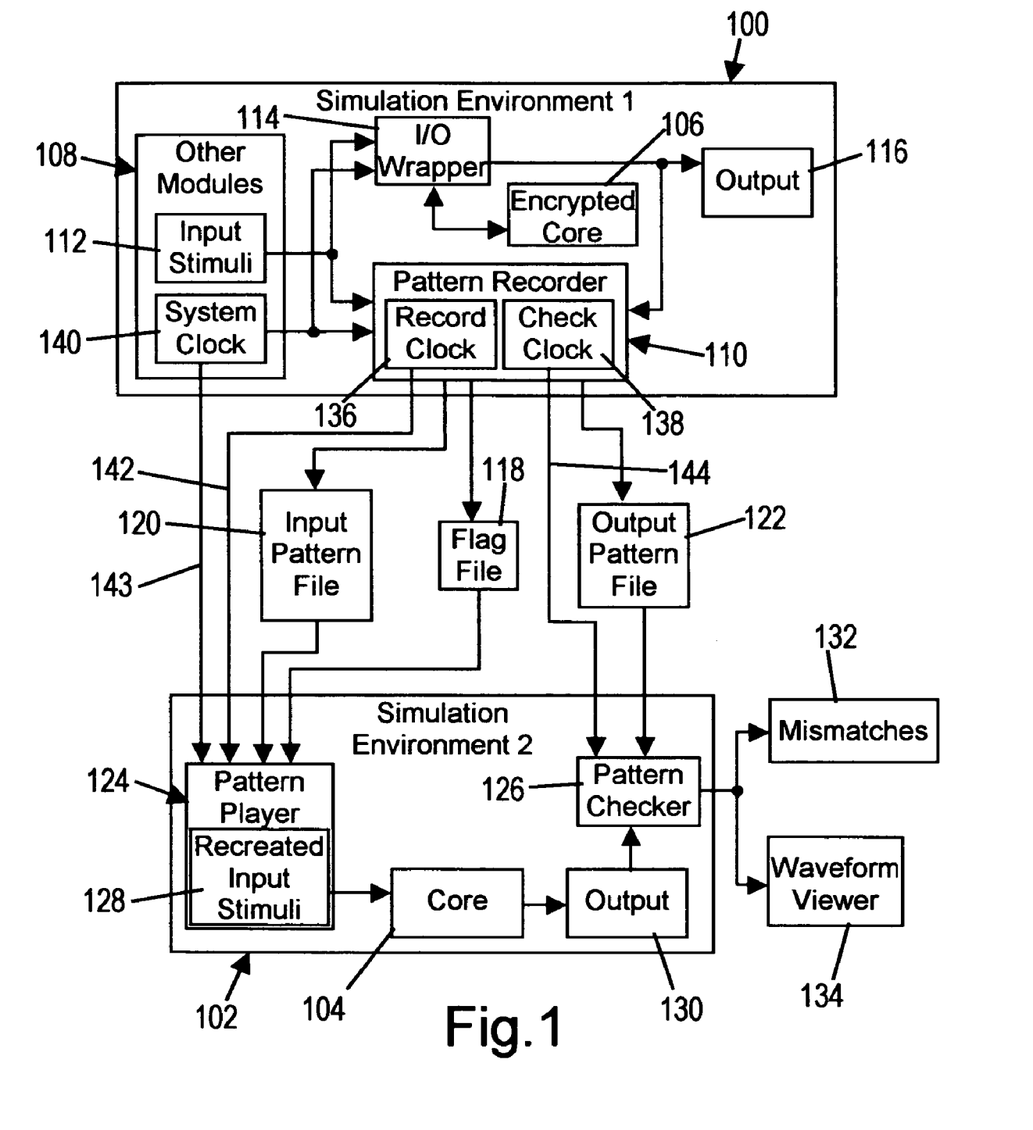
FIG. 1 is a simplified block diagram of simulation environments and results produced by the simulation environments according to an embodiment of the present invention.

Electronic design companies typically simulate their electronic designs within specific simulation environments 100 and 102, as shown in FIG. 1, using one or more of a variety of computerized circuit simulators. According to various embodiments of the present invention, data generated in one simulation environment 100 is used in another simulation environment 102 to help troubleshoot or debug a problem encountered in the first simulation environment 100. Different design companies, however, may use different simulators. Additionally, different companies may run the simulators on different operating systems. The differences between simulators and operating systems can sometimes affect results obtained when the data generated in one simulation environment 100 is used in the other simulation environment 102. The present invention, however, works independently of whether the companies use the same simulators or operating systems.

For purposes of describing various embodiments of the present invention, it is assumed that a company has designed a circuit core (core 104) described in RTL code in an HDL module. It is also assumed that another company (the customer) wants to incorporate the company's core 104 into a product, or portion of a product, being developed by the customer. To allow the customer to develop its product with the company's core 104, the company provides an encrypted version of the RTL code of the core 104 (encrypted core 106) to the customer. The customer, thus, instantiates the encrypted core 106 within its simulation environment 100 along with one or more circuit modules (other modules 108) of the customer's own circuitry in order to develop its product. The company, on the other hand, uses the unencrypted core 104 in its simulation in order to assist the customer in troubleshooting or debugging its overall design with respect to the functions of the encrypted core 106.

The company has provided the customer with the encrypted core 106, instead of the unencrypted core 104, to restrict access to the source code of the core 104, thereby protecting the company's proprietary designs or intellectual property. Since the customer does not have access to the source code of the encrypted core 106, the customer cannot examine the interior functions of the encrypted core 106 within its simulation environment 100. Instead, the customer can only "see" the top-level I/Os of the encrypted core 106. Thus, when the customer runs a simulation of the encrypted core 106, if the encrypted core 106 does not respond as expected, the customer cannot "dig" into the encrypted core 106 to figure out the problem. The customer is, therefore, generally unable to perform much of the troubleshooting or debugging of its overall design with respect to the functions of the encrypted core 106 without the assistance of the company, since only the company can examine the interior performance of the unencrypted core 104.

Additionally, the customer is usually unwilling to share its other modules 108 with the company, so the company cannot exactly recreate within its simulation environment 102 the same problem encountered by the customer in the customer's simulation environment 100. To get around the issue of both companies unwillingness to share unencrypted source code modules, the customer uses a pattern recorder 110 (a simulation tool or utility) within its simulation environment 100 to generally record input stimuli 112 generated by the other modules 108 and provided to the encrypted core 106 through an input/output (I/O) wrapper 114 (an HDL module that defines the I/Os of the encrypted core 106). The I/O wrapper 114 allows the customer to "view" the top-level I/Os of the encrypted core 106. The pattern recorder 110 also generally records output results (output 116) generated by the encrypted core 106 due to the input stimuli 112. The input stimuli 112 and the output 116 are generally those that are produced within the customer's simulation environment 100 with or without the presence or advantages of the present invention. The pattern recorder 110 preferably "snoops," or monitors, signal activity on the I/Os in order to record the top-level I/O data or the changes to the I/O data.

According to this embodiment, the pattern recorder 110 generates a flag file 118, an input pattern file 120 and an output pattern file 122. The recorded input stimuli are generally represented within the flag file 118 and the input pattern file 120, as described below. The recorded output results are generally represented within the output pattern file 122. These files 118, 120 and 122 are produced by the customer during simulation of part or all of the customer's design when the customer is having difficulty troubleshooting or debugging its design and suspects that the difficulty may be related to the function of the encrypted core 106 (e.g. the output 116 generated by the encrypted core 106 may be erroneous compared to the output that should be generated). The customer, thus, provides the files 118, 120 and 122 to the company to assist in the troubleshooting or debugging of the customer's design with respect to the functions of the encrypted core 106.

The files 118, 120 and 122 are generated with a straightforward sampling of the input stimuli 112 and the output 116. Thus, the files 118, 120 and 122 are not of the types of waveform data files described in the background. The files 118, 120 and 122, thus, can be consistently generated in one simulation environment 100 and used in another simulation environment 102 independent of the simulators and operating systems used for the simulation environments 100 and 102.

To use the files 118, 120 and 122, the company includes within its simulation environment 102 a pattern player 124 and a pattern checker 126 (additional simulation tools or utilities) along with the unencrypted core 104. The pattern player 124 receives the flag file 118 and the input pattern file 120. With these files 118 and 120, the pattern player 124 generally recreates the input stimuli 112 (recreated input stimuli 128) during simulation within the company's simulation environment 102. The pattern player 124 supplies the recreated input stimuli 128 to the core 104. The core 104 generates output results (output 130) in response to the recreated input stimuli 128. The pattern checker 126 receives the output 130 and the output pattern file 122. The pattern checker 126 compares the output 130 with the output pattern file 122 to find any mismatches 132 between the output results from the two simulation environments 100 and 102. Any such mismatches 132 are presented to a user of the company's simulation environment 102 to investigate the cause of the mismatch.

Additionally, the pattern checker 126 supplies waveforms of the output 130 and the output pattern file 122 to any appropriate waveform viewer 134. The waveform viewer 134 displays the waveforms of the output 130 and/or the output pattern file 122, so the user can further investigate the problem encountered by the customer. Although there are differences between various available waveform viewers, the present invention is independent of the particular waveform viewer 134 used, since the pattern checker 126 works with straightforward samplings of the outputs 116 and 130.

The pattern recorder 110 generally uses a "record clock" 136 with which to control sampling and recording of the input stimuli 112 and a "check clock" 138 with which to control sampling and recording of the output 116. The customer's design generally includes a "system clock" 140 that controls operation of various digital circuits within the other modules 108, as well as within the encrypted core 106. The pattern recorder 110 generally creates the record clock 136 and the check clock 138 from the system clock 140.

The resolution or frequency at which the input stimuli 112 are sampled for recording affects how well the recorded input stimuli matches the actual input stimuli 112. A relatively low sampling resolution (i.e. a relatively long time between sampling points) may produce a poor match between the recorded input stimuli and the actual input stimuli 112, resulting in incorrect stimulation of the core 104 and an inability to reproduce the output results or the problem encountered by the customer.

The input stimuli 112 is sampled at least once during each cycle of the record clock 136, so the resolution of the sampling of the input stimuli 112 is proportional to the frequency of the record clock 136. In other words, a faster record clock 136 will result in a higher sampling resolution, or rate (i.e. a shorter time between sampling points). Additionally, according to various embodiments, the state of the input stimuli 112 is sampled on the rising edge, on the falling edge or on both edges of each cycle of the record clock 136 and/or at intervals between the edges. Sampling points at both edges of each cycle of the record clock 136 will result in a higher sampling resolution than sampling points only at the rising or falling edge. Additional sampling points between the edges will result in an even higher sampling resolution.

It is generally preferable to use a record clock 136 with a frequency that will result in a sampling resolution of the input stimuli 112 that produces a recorded input stimuli that fairly accurately reflects the actual input stimuli 112. Discrepancies between the recorded input stimuli and the actual input stimuli 112 may particularly be the result of asynchronous signals within the input stimuli 112, since the asynchronous signals may change logic values at any time within a clock cycle. Synchronous signals, on the other hand, change logic values at known points within a clock cycle, e.g. a cycle of the system clock 140.

According to various embodiments, the record clock 136 is a multiple, or integer multiple, (e.g. 2×, 3×, 4×, etc.) of the system clock 140. The multiple value may be selected depending on how much asynchronous activity there may be in the input stimuli 112 or on how close to the point at which their logic values change the asynchronous signals need to be sampled. For example, a record clock 136 that has twice the frequency of the system clock 140 in a simulation environment 100 that samples the input stimuli 112 on both edges of the record clock 136 will sample the input stimuli 112 four times during each cycle of the system clock 140. Thus, the recorded asynchronous signals will differ from the actual asynchronous signals of the input stimuli 112 by no more than one quarter of a period of the system clock 140. Additional sampling points between the edges of the record clock 136 may further reduce discrepancies between the recorded asynchronous signals and the actual asynchronous signals. The actual sampling rate may depend on the timing of the actual asynchronous signals, so the recorded asynchronous signals are changed in the proper order, so that the recreated input stimuli 128 can be properly generated.

Information 142 describing the record clock 136 (e.g. the frequency of the record clock 136 and the edge or edges on which the input stimuli 112 are sampled) and the sampling rate is passed as parameters to the pattern player 124. With these parameters, the pattern player 124 can correctly generate the recreated input stimuli 128 from the input pattern file 120 and the flag file 118, because the pattern player 124 preferably generates the recreated input stimuli 128 with the same clock and at the same sampling rate as the pattern recorder 110 sampled and recorded the input stimuli 112. The pattern player 124 also receives information 143 describing the system clock 140, so the core 104 can be controlled properly when stimulated by the recreated input stimuli 128. Furthermore, information 144 describing the check clock 138 is passed as parameters to the pattern checker 126, so the pattern checker 126 can correctly sample the output 130 and compare it to the contents of the output pattern file 122.

Similar to the discussion of the recording of the input stimuli 112, the resolution or frequency at which the output 116 is sampled for recording affects how well the output pattern file 122 matches the actual output 116. The output 116 is sampled at least once during each cycle of the check clock 138, so the resolution of the sampling of the output 116 is proportional to the frequency of the check clock 138. Additionally, according to various embodiments, the state of the output 116 is sampled on the rising edge, on the falling edge or on both edges of each cycle of the check clock 138. However, unlike the recorded input stimuli, the recorded output (in the output pattern file 122) from the customer's simulation environment 100 is only used to check whether the output 130 from the company's simulation environment 102 is correct. Therefore, the level of accuracy in or the resolution of the output pattern file 122 is not as significant as that for the recorded input stimuli, as discussed above. Thus, any appropriate frequency for the check clock 138 may be sufficient. According to one embodiment, the check clock 138 is the same as the system clock 140.

If the recreated input stimuli 128 and the output pattern file 122 accurately reflect the input stimuli 112 and the output 116, respectively, then it might be expected that the pattern checker 126 would discover no mismatches 132 between the output 130 and the output pattern file 122, since the cores 104 and 106 are essentially the same. The presence of the mismatches 132, thus, might indicate that perhaps the sampling rate of the input stimuli 112 was too low, so the recorded input stimuli did not properly reflect the actual input stimuli 112. However, the mismatches 132 typically occur when the encrypted core 106 has not been compiled correctly by the customer's simulator. For example, the customer may not have used the correct compile time options, flags or constructs or environment settings. In this case, the encrypted core 106 would get compiled incorrectly and run incorrectly in the customer's simulation environment 100, and the output 130 would not match the output pattern file 122. In this manner, the pattern checker 126 generally provides a "first pass" analysis of the output 130 and the output pattern file 122. Afterwards, a more involved analysis of the functioning of the core 104 may be performed with the waveform viewer 134 and by inspecting the source code of the core 104. The pattern checker 126 also enables troubleshooting or debugging of problems in the pattern player 124.

Before beginning the simulation and recording the input stimuli 112, the pattern recorder 110 receives a parameter indicating the number of I/Os defined in the I/O wrapper 114 for the encrypted core 106. The pattern recorder 110 uses this parameter to set the width of a line of data in the input pattern file 120. The pattern recorder 110, thus, can work with any number of I/Os. Therefore, the pattern recorder 110 can work with any encrypted core 106.

Additionally, the pattern recorder 110 can work with more than one I/O wrapper 114 for the same encrypted core 106 to supply a different set of I/Os for the encrypted core 106. Different I/O wrappers 114 may allow the same encrypted core 106 to operate in different environments. For example, if the encrypted core 106 has communication functions that can operate in either an Ethernet environment or a USB (Universal Serial Bus) environment, then two different I/O wrappers 114 would encapsulate different sets of I/Os, and the pattern recorder 110 would be able to record the input stimuli 112 for either.

A line of data in the input pattern file 120 is generally an input array of bits representing each of the input signals. The number of bits of the input array is the parameter passed by the I/O wrapper 114 to the pattern recorder 110. This parameter is also supplied to the pattern player 124, so the pattern player 124 can know how to generate the recreated input stimuli 128 from the flag file 118 and the input pattern file 120.

Figure 2:
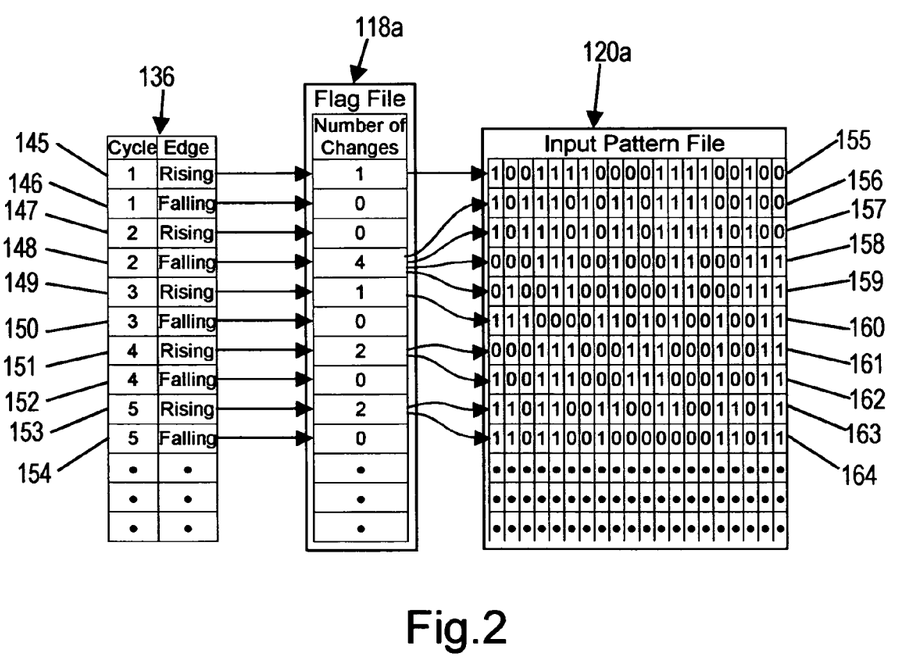
FIG. 2 is a simplified block diagram of data structures for a flag file and an input pattern file generated by and used in the simulation environments shown in FIG. 1 according to an embodiment of the present invention.

An exemplary flag file 118a and an exemplary input pattern file 120a are shown in FIG. 2 with exemplary entries for exemplary edges 145-154 of the record clock 136. For this example, it is assumed that there are at least four sampling points for each edge 145-154 of the record clock 136, since the largest entry in the flag file 118a is four. Furthermore, for this example, it is assumed that there are twenty inputs to the cores 104 and 106 (FIG. 1), since there are twenty bits in each input array row 155-164 of the input pattern file 120a. According to one embodiment, at each edge (145-154) of the record clock 136, the pattern recorder 110 records to the flag file 118a the number of sampling points (since the previous edge of the record clock 136) at which at least one bit in the input array of the input stimuli 112 changed since a previous sampling point. With this data recorded in the flag file 118a, the pattern recorder 110 is relieved of having to record the input array, or status, of the input stimuli 112 at every sampling point. Instead, the pattern recorder 110 records the input array to the input pattern file 120a only when there is at least one change in the input array at any given sampling point. The entries in the flag file 118a for edges 146-154, thus, indicate the number of sampling points between these edges 146-154 and their corresponding previous edges 145-153, respectively, at which the input array changed. The exemplary entries for edges 146, 147, 150, 152 and 154, for example, are zero, indicating that the input array changed at none of the sampling points between these edges 146, 147, 150, 152 and 154 and their corresponding previous edges 145, 146, 149, 151 and 153, respectively, so there are no corresponding entries in the input pattern file 120a for these edges 146, 147, 150, 152 and 154. The exemplary entry for edge 145, however, is one, since edge 145 represents the starting point for the simulation or for the recording of the data, and corresponds to an exemplary initial recorded input array in row 155 of the input pattern file 120a. The exemplary entry for edge 148 is four, indicating that the input array changed at four of the sampling points between the edges 147 and 148, and corresponding to the exemplary recorded input arrays in four rows 156-159 of the input pattern file 120a. The exemplary entry for edge 149 is one, indicating that the input array changed at only one of the sampling points between the edges 148 and 149, and corresponding to the exemplary recorded input array in row 160 of the input pattern file 120a. The exemplary entry for edge 151 is two, indicating that the input array changed at two of the sampling points between the edges 150 and 151, and corresponding to the exemplary recorded input arrays in rows 161 and 162 of the input pattern file 120a. The exemplary entry for edge 153 is two, indicating that the input array changed at two of the sampling points between the edges 152 and 153, and corresponding to the exemplary recorded input arrays in rows 163 and 164 of the input pattern file 120a.

The pattern player 124 (FIG. 1) reads the input array rows 155-164 from the input pattern file 120a and generates the recreated input stimuli 128 by supplying the bit values of the input array rows 155-164 to the core 104 in accordance with the record clock frequency and sampling rate information 142. The change information in the flag file 118a indicates to the pattern player 124 when to supply the next input array row 155-164 to the core 104. When the data doesn't change, the pattern player 124 maintains the previous bit values of the previous input array row 155-164. When the number of sampling points having changed data is greater than zero, the pattern player 124 supplies the next one or more rows of the input pattern file 120a, depending on the number of changes, to the core 104.

Figure 3:
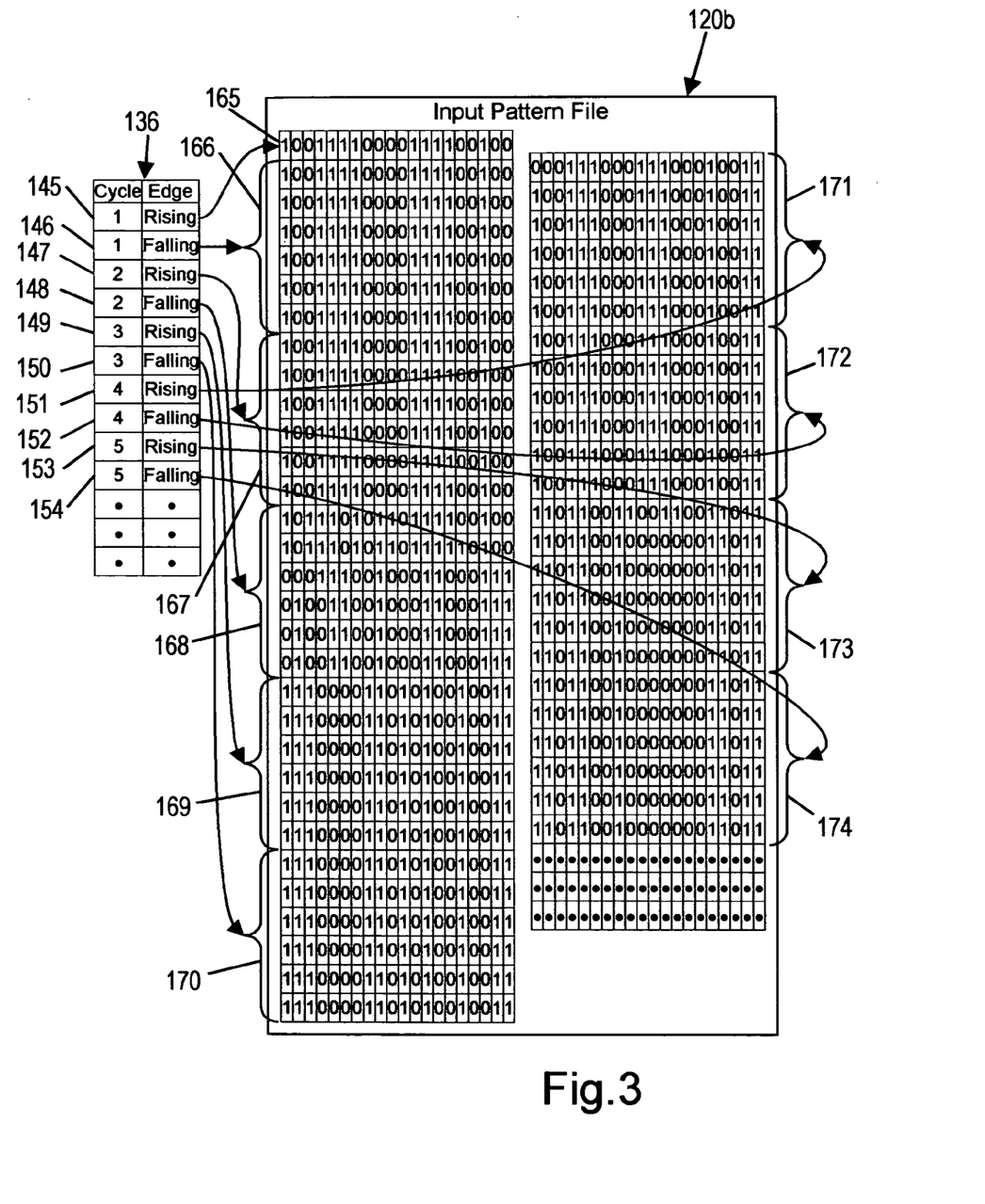
FIG. 3 is a simplified block diagram of a data structure for another input pattern file generated by and used in the simulation environments shown in FIG. 1 according to another embodiment of the present invention.

According to the embodiment illustrated by FIG. 2, the input pattern file 120a can be kept smaller than it would be if the input array were recorded at every sampling point, as illustrated by another embodiment using another exemplary input pattern file 120b, shown in FIG. 3. In the embodiment illustrated in FIG. 3, though, the input pattern file 120b may be used without a flag file 118. The pattern recorder 110 records the entire input array into the input pattern file 120b at each sampling point, so it is not necessary to keep track of the number of sampling points at which any of the bit values of the input stimuli 112 change between edges of the record clock 136. The pattern player 124 supplies to the core 104 the bit values of the next subsequent input array row 156-164 on each sampling point in accordance with the record clock frequency and sampling rate information 142.

The first row 165 of the input pattern file 120b corresponds to, and has the same data as, the initial row 155 (FIG. 2) in the input pattern file 120a. It is assumed for this example that there are six sampling points for each edge of the record clock 136. Therefore, the next six rows 166 of the input pattern file 120b do not have any corresponding entry in the input pattern file 120a, since these rows 166 correspond to edge 146 of the record clock 136, which had zero sampling points at which the input array changed, according to the flag file 118a (FIG. 2). Likewise, rows 167, 170, 172 and 174 do not have any corresponding entries in the input pattern file 120a, since these rows 167, 170, 172 and 174 correspond to edges 147, 150, 152 and 154, respectively, of the record clock 136, which also had zero sampling points at which the input array changed, according to the flag file 118a. In each of these rows 166, 167, 170, 172 and 174 the data merely repeats the previous row, since no changes occurred. Rows 168, on the other hand, correspond to edge 148, which had four sampling points at which the input array changed, according to the flag file 118a. Therefore, only four of the six rows 168 have changed data, which corresponds to the data in rows 156-159 (FIG. 2). The remaining two of the six rows 168 merely repeat data from the previous row. Similarly, rows 169 correspond to edge 149, which had only one sampling point at which the input array changed, according to the flag file 118a. Therefore, only one of the six rows 169 has changed data, which corresponds to the data in row 160 (FIG. 2). The remaining five of the six rows 169 merely repeat data from the previous row. Likewise, rows 171 and 173 correspond to edges 151 and 153, respectively, both of which had only two sampling points at which the input array changed, according to the flag file 118a. Therefore, only two of each of the six rows 171 and 173 have changed data, which corresponds to the data in rows 161-164 (FIG. 2). The remaining four of each of the six rows 171 and 173 merely repeat data from the previous row. The rows in the input pattern file 120b that have data unchanged from a previous row are redundant. The embodiment illustrated in FIG. 2 eliminates this redundancy by inclusion of the flag file 118a. Thereby, the embodiment of FIG. 2 significantly reduces the size of the input pattern file 120, as can be seen by a comparison of FIGS. 2 and 3. Additionally, for a core 104 and 106 that has many more inputs than the twenty shown in the exemplary input pattern files 120a and 120b, the file size reduction enabled by the embodiment illustrated by FIG. 2 is even more significant.

Figure 4:
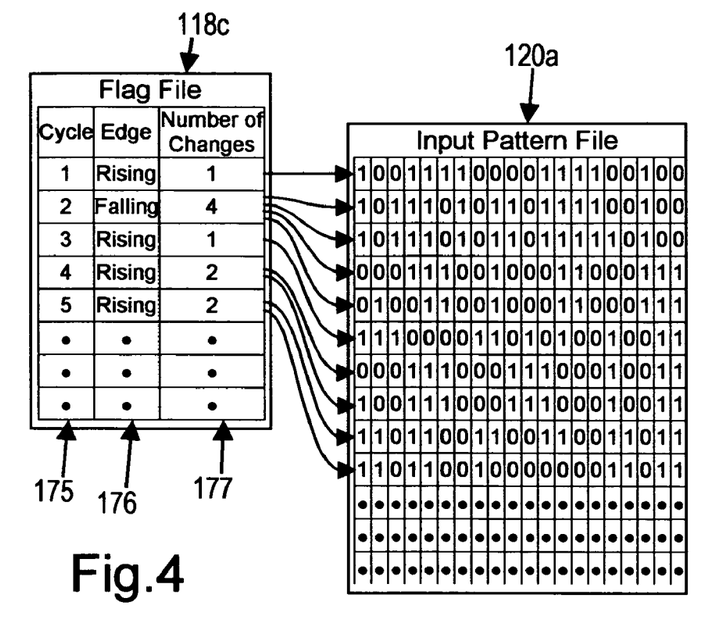
FIG. 4 is a simplified block diagram of data structures for another flag file and another input pattern file generated by and used in the simulation environments shown in FIG. 1 according to yet another embodiment of the present invention.

According to another embodiment, as illustrated by FIG. 4, the pattern recorder 110 creates another exemplary flag file 118c to include record clock information (in columns 175 and 176), but without entry rows in the flag file 118c when the entry in column 177 is zero for the number of sampling points having changed data for an edge of the record clock 136. Therefore, the pattern player 124 uses the record clock information (in columns 175 and 176) to determine when to use the next entries in both the change column 177 and the input pattern file 120a.

Figure 5:
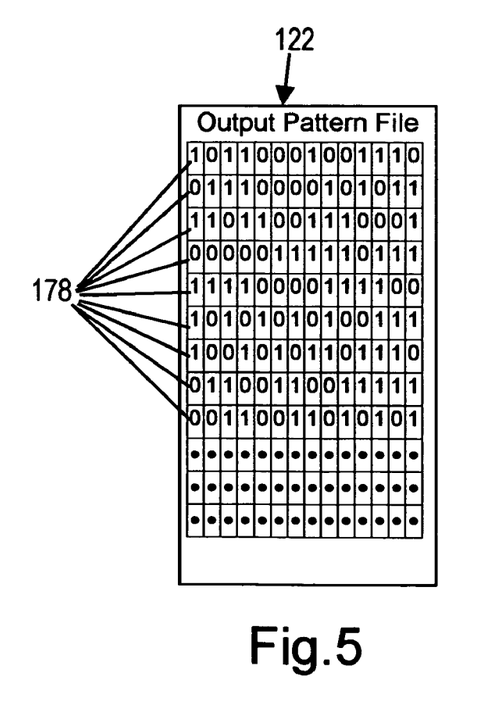
FIG. 5 is a simplified block diagram of a data structure for an output pattern file generated by and used in the simulation environments shown in FIG. 1 according to an embodiment of the present invention.

An exemplary embodiment of the output pattern file 122 is shown in FIG. 5. According to this embodiment, a line of data 178 in the output pattern file 122 is generally an output array of bits representing each of the output signals supplied from the I/O wrapper 114 to the output 116. The number of bits of the output array is another parameter passed by the I/O wrapper 114 to the pattern recorder 110. This parameter is also supplied to the pattern checker 126, so the pattern checker 126 can know how to read the output pattern file 122 and the output 130 (FIG. 1) in order to compare the two output results. In the embodiment shown, the output pattern file 122 includes every output array of the output 116, even when none of the bits in any of the lines of data 178 has changed from the previous line of data 178. As an alternative, the output pattern file 122 could be coordinated with a flag file in order to make the output pattern file 122 smaller in the same manner that the input pattern file 120 is coordinated with the flag file 118 in FIGS. 2 and 4 in order to make the input pattern file 120 smaller. However, the output pattern file 122 is typically much smaller than the input pattern file 120, because the sampling resolution does not have to be as great, so the output pattern file 122 is typically not as large as the input pattern file 120, even without the benefit of a flag file.

Figure 6:
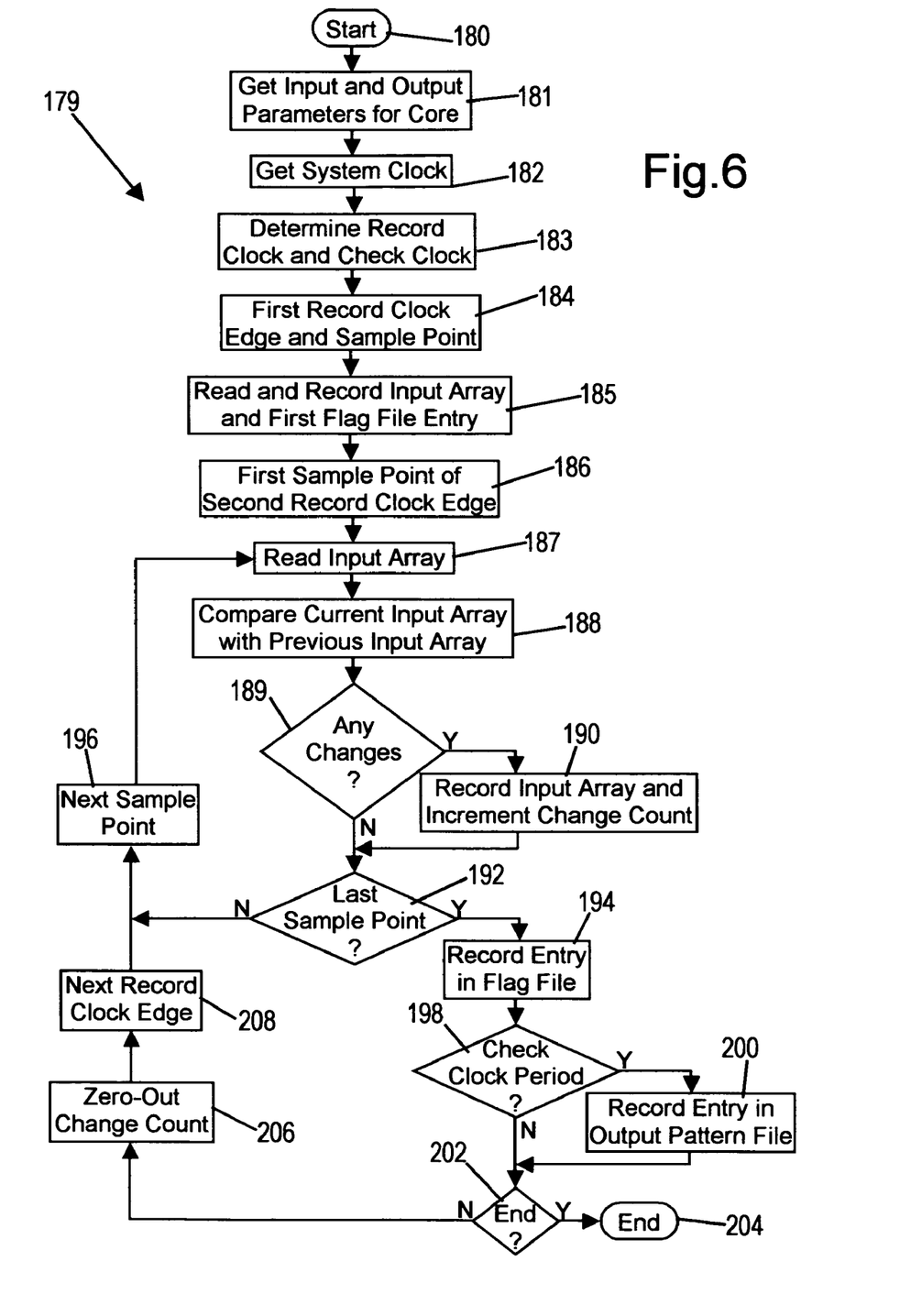
FIG. 6 is a flow chart of a simplified procedure for recording input stimuli and output results in the simulation environments shown in FIG. 1 according to an embodiment of the present invention.

An exemplary procedure 179 for the pattern recorder 110 to sample and record (during a simulation in the customer's simulation environment 100) the input stimuli 112 and the output 116 and to generate the flag file 118, the input pattern file 120 and the output pattern file 122 is shown in FIG. 6. This example assumes that the pattern recorder 110 generates the flag file 118 and the input pattern file 120 as shown in the embodiment illustrated in FIG. 2. Upon starting (at 180), the pattern recorder 110 (at 181) gets the input and output parameters for the encrypted core 106 from the I/O wrapper 114. At 182, the pattern recorder 110 gets information describing the system clock 140 (FIG. 1), so the pattern recorder 110 can determine (at 183) the record clock 136 and the check clock 138.

Upon the first edge of the record clock 136, which is also the first sample point, as detected at 184, the pattern recorder 110 reads (or samples) (at 185) the first state of the input array of the input stimuli 112, records the data as the initial entry in the input pattern file 120 and makes the appropriate first entry in the flag file 118. This example assumes that sample points occur at each edge (rising and falling) of the record clock 136 as well as between the edges. Additionally, the first edge at which a sample is to be read may be at the beginning of the simulation of the simulation environment 100 or at some appropriate point after the beginning of the simulation.

Upon the first sample point of the second edge of the record clock 136, as detected at 186, the pattern recorder 110 reads (at 187) the current state of the input array of the input stimuli 112. The read at 187 will be repeated at each subsequent sample point, as will be shown below. The pattern recorder 110 compares (at 188) the current input array (read at 187) with the previous input array (read at 185 or 187) to determine whether any of the bits of the input array have changed. If there are any changes, as determined at 189, the pattern recorder 110 records (at 190) the input array to the input pattern file 120 and increments a "change count" indicating the number of sample points at which the input array has changed. If the current sample point is the last sample point for the current edge of the record clock 136, as determined at 192, the change count is recorded (at 194) as the next entry in the flag file 118. Otherwise, if the current sample point is not the last sample point for the current edge of the record clock 136, as determined at 192, the patter recorder 110 goes to the next sample point (at 196) and returns to 187 to read the input array at the new sample point. In addition to recording the entry in the flag file 118 at 194, if it is determined (at 198) that the procedure is at the point in the period of the check clock 138 at which the output array is to be recorded in the output pattern file 122, then the pattern recorder 110 records (at 200) the current output array as the next entry in the output pattern file 122.

The last sample point, or end of the procedure 179, may be at the end of the overall simulation or at some appropriate point within the simulation. If the procedure 179 has reached the end, as determined at 202, then the procedure 179 ends at 204. Otherwise, the pattern recorder 110 zeroes-out (at 206) the change count, proceeds (at 208) to the next record clock edge, which is also the next sample point (as determined at 196), and returns to 187 to read the next state of the input array and to repeat 187-208 to build the files 118, 120 and 122 until reaching the end (at 204).

Figure 7:
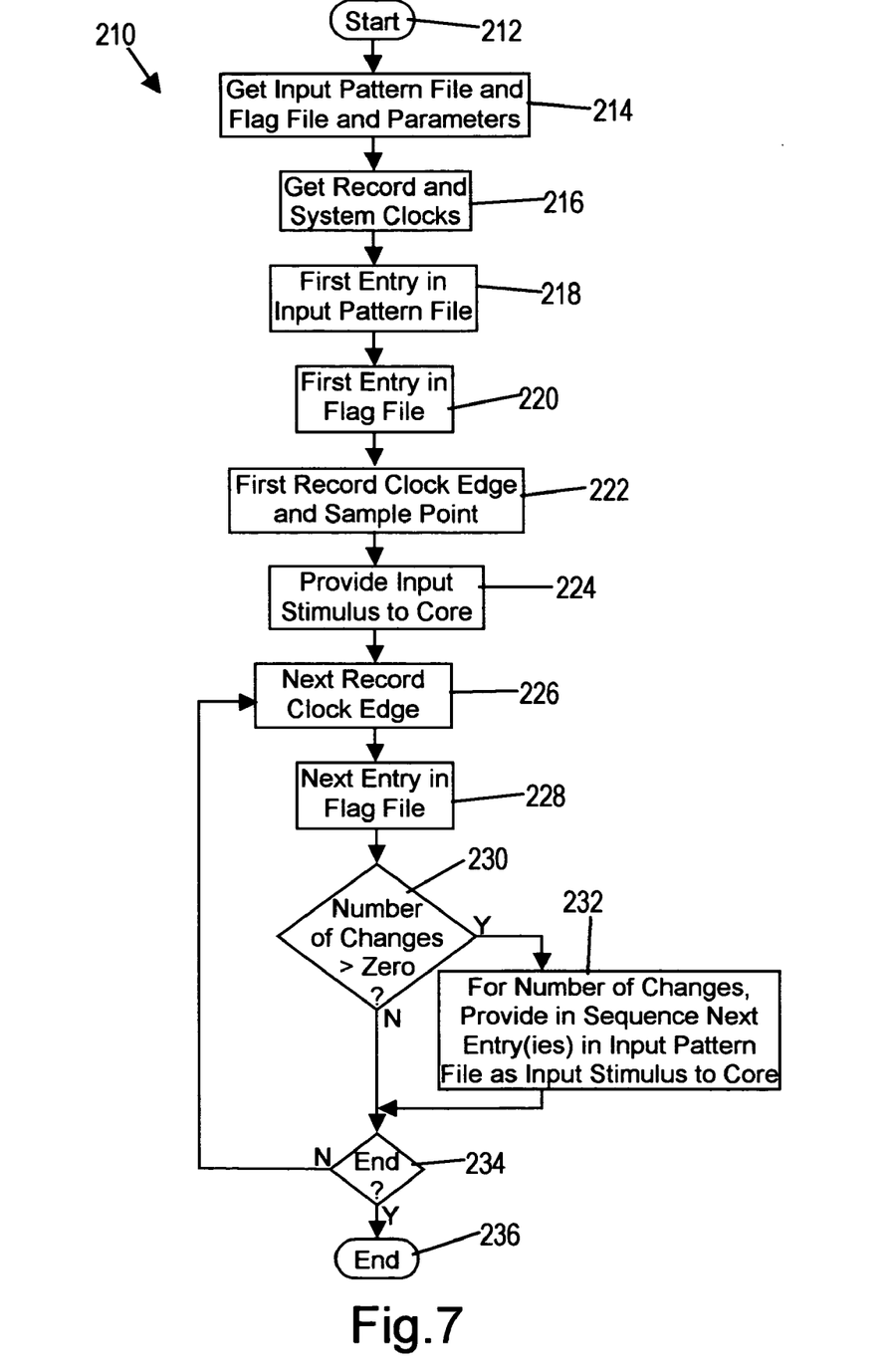
FIG. 7 is a flow chart of a simplified procedure for playing back recorded input stimuli in the simulation environments shown in FIG. 1 according to an embodiment of the present invention.

An exemplary procedure 210 for the pattern player 124 to play back (during a simulation in the company's simulation environment 102) the recorded input stimuli by generating the recreated input stimuli 128 from the flag file 118 and the input pattern file 120 is shown in FIG. 7. This example assumes that the pattern recorder 110 has generated the flag file 118 and the input pattern file 120 as shown in the embodiment illustrated in FIG. 2. Upon starting (at 212), the pattern player 124 gets (at 214) the input pattern file 120 and the flag file 118 and parameters indicating the width of a line in the input pattern file 120 and the size of the input pattern file 120. The line-width and size parameters enable the pattern player 124 to use only a minimum amount of computer memory space to run the simulation in the company's simulation environment 102, thereby optimizing the run time. At 216, the pattern player 124 gets the information 142 and 143 describing the record clock 136 and the system clock 140, respectively.

The pattern player 124 obtains the first entry, row or line in the input pattern file 120 and in the flag file 118 at 218 and 220, respectively, to generate the first line of the recreated input stimuli 128. The pattern player 124 determines (at 222) that it is at the first edge of the record clock 136.

The pattern player 124 provides (at 224) the first line of the recreated input stimulus 128 as the recreated input stimuli 128 to the core 104, since the pattern player 124 is at the first edge of the record clock 136.

The pattern player 124 proceeds (at 226) to the next edge of the record clock 136. The pattern player 124 reads (at 228) the next entry, row or line, in the flag file 118. If the number of changes indicated in the current entry of the flag file 118 is greater than zero, as determined at 230, then, for the total number of changes indicated, the pattern player 124 reads (at 232) the next entry(ies) in the input pattern file 120 and provides each entry in sequence as the recreated input stimuli 128 to the core 104. Otherwise, the pattern player 124 maintains the current stimulus previously generated from data received from the input pattern file 120 until the end of the current edge of the record clock 136.

If the pattern player 124 has proceeded past the end of the data in the flag file 118 and the input pattern file 120, as determined at 234, then the procedure 210 ends at 236. Otherwise, the pattern player 124 returns to 226 to proceed to the next record clock edge and to repeat 226-234 until the end of the simulation.

An exemplary procedure 238 for the pattern checker 126 to check (during a simulation in the company's simulation environment 102) the output 130 (FIG. 1) against the contents of the output pattern file 122 is shown in FIG. 9. Upon starting (at 240), the pattern checker 126 gets (at 242) the output pattern file 122 and parameters indicating the width of a line in the output pattern file 122. At 244, the pattern checker 126 gets the information 144 describing the check clock 138.

Figure 8:
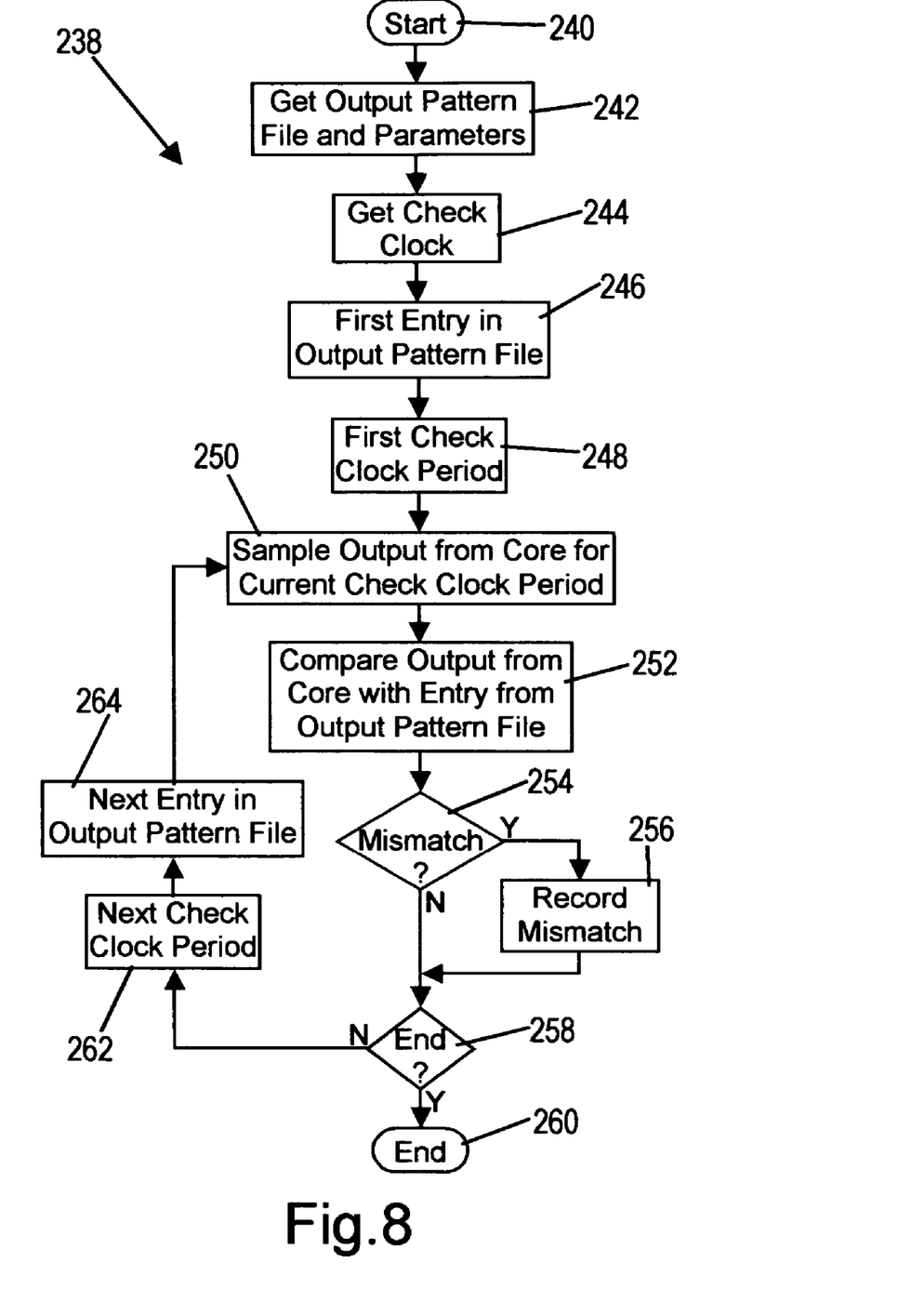
FIG. 8 is a flow chart of a simplified procedure for comparing recorded output results with generated output results in the simulation environments shown in FIG. 1 according to an embodiment of the present invention.

The pattern checker 126 obtains or reads (at 246) the first entry, row or line in the output pattern file 122. The pattern checker 126 determines (at 248) that it is at the appropriate point in the first cycle of the check clock 138 (e.g. the rising or falling edge of the check clock 138) to sample the output 130.

The pattern checker 126 samples (at 250) the current state of the output array of the output 130 from the core 104 for the current check clock period. The pattern checker 126 compares (at 252) the sampled output array from the core 104 with the current entry line read from the output pattern file 122. If there is a mismatch between any bits of the sampled output array from the core 104 and the current entry line read from the output pattern file 122, as determined at 254, then information describing the mismatched bits is recorded (at 256) in the mismatches 132 (FIG. 1). Otherwise, no mismatch is recorded.

If the pattern checker 126 has reached the end of the data in the output pattern file 122, as determined at 258, then the procedure 238 ends at 260. Otherwise, the pattern checker 126 proceeds (at 262) to the next period of the check clock 138. The pattern checker 126 obtains or reads (at 264) the next entry, row or line in the output pattern file 122. The procedure 238 then returns to 250 to sample the current state of the output array of the output 130 from the core 104 for the current check clock period and to repeat 250-258, 262 and 264 until reaching the end of the data in the output pattern file 122.

Presently preferred embodiments of the present invention and many of its improvements have been described with a degree of particularity. This description is of preferred examples of implementing the invention, and is not necessarily intended to limit the scope of the invention. The scope of the invention is defined by the following claims.

We claim:

1. A system for debugging simulation of a circuit core in a simulated environment, comprising:
   a pattern recorder connected in simulation to a first core to receive and record input stimuli as at least one input stimuli array, the input stimuli provided to the first core and to receive and record a first output array, wherein the first output array represents each output signal generated by the first core in response to the input stimuli;
   a pattern player connected in simulation to a second core to provide the recorded at least one input stimuli array to the second core; and
   a pattern checker connected in simulation to the second core to receive a second output array, wherein the second output array represents each output signal generated by the second core in response to the recorded at least one input stimuli array, the pattern checker determining whether the second output array matches the first output array,
   wherein the pattern recorder counts and periodically records a number of sampling points at which the input stimuli changed since a previous periodic recording of the number of sampling points,
   the pattern recorder records a current state of the input stimuli as an input stimuli array for each count of the periodically recorded number of sampling points each time the periodically recorded number of sampling points is greater than zero,
   the pattern player sequentially reads the periodically recorded number of sampling points at which the input stimuli changed since a previous periodic recording of the number of sampling points,
   upon the periodically recorded number of sampling points being greater than zero, the pattern player provides a next array of the at least one input stimuli array to the second core for each count of the recorded number of sampling points,
   upon the periodically recorded number of sampling points being equal to zero, the pattern player continues to provide a current array of the at least one input stimuli array to the second core,
   the first core is an encrypted version of the second core,
   the pattern recorder records the number of sampling points at which the input stimuli changed since a previous periodic recording of the number of sampling points in a flag file and the pattern recorder records the at least one input stimuli array in an input pattern file that is separate from the flag file.

2. A system as defined in claim 1 wherein:
the pattern recorder and the first core are instantiated in a first simulation environment that further includes a module of a circuit intended to operate with the first core; and
the pattern player, the pattern checker and the second core are instantiated in a second simulation environment within which performance of the first and second cores is debugged.

3. A system as defined in claim 1 wherein:
the first core is compiled in a desired environment; and
performance of the second core under playback of the recorded input stimuli enables determination of an error in the compiling of the first core.

4. A system as defined in claim 1 wherein:
the first core is compiled in a desired environment; and
any mismatches between the first output array and the second output array enable determination of an error in the compiling of the first core.

5. A system as defined in claim 1 wherein:
performance of the second core under control of the recorded input stimuli enables determination of a design error in the second core.

6. A system as defined in claim 1 wherein:
the pattern player sequentially reads the periodically recorded number of sampling points at which the input stimuli changed since a previous periodic recording of the number of sampling points from the flag file;

upon the periodically recorded number of sampling points being greater than zero, the pattern player provides a next array of the at least one input stimuli array from the input pattern file to the second core for each count of the periodically recorded number of sampling points; and upon the periodically recorded number of sampling points being equal to zero, the pattern player continues to provide a current array of the at least one input stimuli array from the input pattern file to the second core.

7. A system as defined in claim 1 wherein:
the pattern recorder records the counted number of sampling points at which the input stimuli changed on each edge of a cycle of a clock.

8. A system as defined in claim 7 wherein:
the aforementioned clock is a first clock that controls sampling of the input stimuli by the pattern recorder;
a second clock controls functioning of the first core; and
the first clock has a frequency that is a multiple of a frequency of the second clock.

9. A system as defined in claim 8 wherein:
the pattern recorder records the first output array from the first core by periodically recording a current state of the first output array during each cycle of the second clock.

10. A method of debugging simulation of a circuit core comprising:
providing input stimuli to a first core during simulation;
recording the input stimuli as at least one input stimuli array, the input stimuli provided to the first core, wherein the recording of the input stimuli includes:
counting and periodically recording a number of sampling points at which the input stimuli changed since a previous periodic recording of a counted number of sampling points; and
recording a current state of the input stimuli at each count of the sampling points;
generating a first output array, wherein the first output array represents each output signal generated from the first core due to the input stimuli;
recording the first output array from the first core;
providing the recorded input stimuli to a second core, wherein the providing the recorded input stimuli to a second core includes:
sequentially reading the periodically recorded number of sampling points at which the input stimuli changed since a previous periodic recording of the number of sampling points,
upon the periodically recorded number of sampling points being greater than zero, providing a next array of the at least one input stimuli array to the second core for each count of the periodically recorded number of sampling points, and
upon the periodically recorded number of sampling points being equal to zero, continuing to provide a current array of the least one input stimuli array to the second core;
generating a second output array, wherein the second output array represents each output signal generated from the second core due to the recorded input stimuli; and
determining whether the second output array matches the first output array;
and wherein the first core is an encrypted version of the second core,
wherein periodically recording a number of sampling points at which the input stimuli changed since a previous periodic recording of a counted number of sampling points comprises periodically recording a number of sampling points at which the input stimuli changed since a previous periodic recording of a counted number of sampling points in a flag file and recording a current state of the input stimuli at each count of the sampling points comprises recording the current state of the input stimuli in an input pattern file that is separate from the flag file.

11. A method as defined in claim 10, further comprising:
receiving the input stimuli provided to the first core by a pattern recorder module in order to perform the recording of the input stimuli;
receiving the generated first output array from the first core by the pattern recorder module in order to perform the recording of the first output array;
providing the recorded input stimuli to a pattern player module in order to perform the providing of the recorded input stimuli to the second core by the pattern player module;
providing the recorded first output array to a pattern checker module; receiving the generated second output array from the second core by the pattern checker module; and
performing by the pattern checker module the determining of whether the second output array matches the first output array.

12. A method as defined in claim 10 further comprising:
including the first core in a first simulation environment further including a module of a circuit intended to operate with the first core; and
including the second core in a second simulation environment intended to debug performance of the first and second cores.

13. A method as defined in claim 10 further comprising:
compiling the first core in a desired environment; and
examining performance of the second core under playback of the recorded input stimuli to determine an error in the compiling of the first core.

14. A method as defined in claim 10 further comprising:
compiling the first core in a desired environment; and
examining any mismatches between the first output array and the second output array to determine an error in the compiling of the first core.

15. A method as defined in claim 10 further comprising:
examining performance of the second core under control of the recorded input stimuli to determine a design error in the second core.

16. A method as defined in claim 10, wherein
sequentially reading the periodically recorded number of sampling points at which the input stimuli changed since a previous periodic recording of the number of sampling points comprises sequentially reading the periodically recorded number of sampling points at which the input stimuli changed since a previous periodic recording of the number of sampling points from the flag file;
wherein providing a next array of the at least one input stimuli array to the second core for each count of the periodically recorded number of sampling points comprises providing a next array of the at least one input stimuli array from the input pattern file to the second core for each count of the sampling points; and
wherein continuing to provide a current array of the at least one input stimuli array to the second core comprises continuing to provide a current array of the at least one input stimuli array read from the input pattern file provided to the second core.

17. A method as defined in claim 10 wherein:
periodically recording of the counted number of sample points at which the input stimuli changed since a previous periodic recording of a counted number of sampling points occurs on each edge of a cycle of a clock.

18. A method as defined in claim 17 wherein:
the aforementioned clock is a first clock that controls sampling of the input stimuli;
a second clock controls functioning of the first core; and
the first clock has a frequency that is a multiple of a frequency of the second clock.

19. A method as defined in claim 18 wherein:
the recording of the first output array from the first core further comprises periodically recording a current state of the first output array during each cycle of the second clock.

* * * * *